(12) United States Patent
Sasaki (10) Patent No.: US 6,534,334 B2
(45) Date of Patent: Mar. 18, 2003

(54) METHOD OF MANUFACTURING A NON-SINGLE-CRYSTAL THIN FILM SOLAR CELL

(75) Inventor: Toshiaki Sasaki, Kanagawa (JP)

(73) Assignee: Fuji Electric Corporate Research and Development, Ltd. (JP)

(*) Notice: Subject to any disclaimer, the term of this patent is extended or adjusted under 35 U.S.C. 154(b) by 0 days.

(21) Appl. No.: 09/883,537

(22) Filed: Jun. 18, 2001

(65) Prior Publication Data

US 2002/0014263 A1 Feb. 7, 2002

(30) Foreign Application Priority Data

Jun. 16, 2000 (JP) .......................... 2000-181892

(51) Int. Cl.⁷ ............................ H01L 31/036
(52) U.S. Cl. ..................... 438/57; 438/96; 438/97; 136/255; 136/258; 136/261
(58) Field of Search ................. 136/255, 258, 136/261, 249; 438/57, 97, 478, 96

(56) References Cited

U.S. PATENT DOCUMENTS 5,571,749 A * 11/1996 Matsuda et al. ............. 438/484
5,677,236 A * 10/1997 Saitoh et al. ................ 438/485
5,769,963 A *  6/1998 Fujioka et al. .............. 136/258
6,252,158 B1 *  6/2001 Higashikawa et al. ...... 136/258

OTHER PUBLICATIONS

"Effects of Deposition Conditions of p–type uc–Si Layer on a–Si Based Solar Cells"; Toshiaki Sasaki et al.; Technical Digest of the International PVSEC–11, Sapporo, Hokkaido, Japan; 1999; pp. 185–186.

"Fast Etching of Amorphous and Microcrystalline Silicon By Hot–Filament Generated Atomic Hydrogen"; H.N. Wanka et al.; Mat. Res. Soc. Symp. Proc. vol. 467; 1997 Materials Research; pp. 651–656.

"On the Way Towards High Efficiency Thin Film Silicon Solar Cells by the "Micromorph" Concept"; J Meier et al.; Mat. Res. Soc. Symp. Proc. vol. 420; 1996 Materials Research Society; pp. 3–14.

"Controlled nucleation of thin microcrystalline layers for recombination junction in a–Si stacked cells"; N. Pellaton Vaucher et al.; Technical Digest of the International PVSEC–9, Miyazaki, Japan; 1996; pp. 651–652.

"Structural study of p–type uc–Si layer for solar cell application"; Toshiaki Sasaki et al.; Journal of Non–Crystalline Solids 266–269 (2000); N.H. Elsevier; pp. 171–175.

* cited by examiner

Primary Examiner—Nam Nguyen
Assistant Examiner—Brian L Mutschler
(74) Attorney, Agent, or Firm—Rossi & Associates (57) ABSTRACT

An n layer, an i layer and a p layer are laminated, in that order, in a non-single-crystal thin film solar cell. The n layer, a part of the n layer, or the n layer and part of the i layer, is formed at a low substrate temperature T1. The i layer and the p layer; the residual n layer, i layer and p layer; or the residual i layer and p layer, are formed at a higher substrate temperature T2 than T1. More particularly, T1 is between about 70° C. and 120° C., and T2 is between about 120° C. and 450° C.

16 Claims, 8 Drawing Sheets

METHOD OF MANUFACTURING A NON-SINGLE-CRYSTAL THIN FILM SOLAR CELL

BACKGROUND OF THE INVENTION

1. Field of the Invention

The present invention generally relates to a method of manufacturing a non-single-crystal thin film solar cell that is composed mainly of a non-single-crystal film and has a pin or pn junction structure.

2. Background

A thin film solar cell with non-single-crystal thin film, more particularly, a non-single-crystal thin film solar cell, such as a silicon non-crystalline thin film, having a pin junction structure comprised mainly of non-single-crystal thin film such as an amorphous silicon (hereinafter referred to as a-Si), a silicon comprised mainly of microcrystalline phases (hereinafter referred to as $\mu$c-Si) (this silicon partially includes a-Si film), and a thin film polycrystalline silicon, can be produced with a larger area at lower temperature and lower cost, as compared to a single-crystal solar cell. This non-single-crystal thin film solar cell is expected to be useful as a large-area thin film solar cell for supplying power.

However, the efficiency of the solar cell comprised of a-Si is lowered, from the beginning, due to the so-called Steabler-Wronski effect, in which the efficiency of the solar cell decreases when exposed to irradiation with light for a long period of time. With respect to this problem, it has recently been reported that it is possible to produce a solar cell with no light-induced degradation by using $\mu$c-Si as a p-type semiconductor layer (hereinafter referred to as a p layer) as the doping layer of a pin-type solar cell, an n-type semiconductor layer (hereinafter referred to as an n layer), and a substantially intrinsic i-type high resistivity layer (hereinafter referred to as an i layer). See pp. 3 of J. Meier, P. Torres, R. Platz, S. Dubail, U. Kroll, A. A. Anna Selvan, N. Pellaton Vaucher Ch. Hof, D. Fischer, H. Keppner, A. Shah, K. D. Ufert, P. Giannoules, J. Koehler, *Mat. Res. Soc. Symp. Proc.* Vol. 420, 1996.

Unlike the a-Si film, the conductivity of the $\mu$c-Si film is never degraded by light irradiation. Thus, it can be considered that the use of the $\mu$c-Si for the solar cell inhibits light degradation.

The light absorption coefficient of the $\mu$c-Si is small on the short wavelength side and is large on the long wavelength side. The use of the $\mu$c-Si for the i layer, which acts as a light absorbing layer, in the pin type solar cell enables the use of long wavelength light and increases the short-circuit current density (hereinafter referred to as Jsc).

On the other hand, the use of $\mu$c-Si for the p layer or the n layer on the light incidence side enables an increase in Jsc, due to the reduced light absorption loss on the short wavelength side. Moreover, the increase in diffusion potential improves the open-circuit voltage (hereinafter referred to as Voc). The use of $\mu$c-Si for the p layer or the n layer on the side opposite to light incidence increases the Voc, due to an increase in the diffusion potential. The use of $\mu$c-Si also increases the fill factor (hereinafter referred to as FF) and Jsc, due to a reduction in contact resistance against the substrate electrode. The formation of a tunnel junction layer by laminating together two or more layers also increases FF and Jsc.

Figure 15:
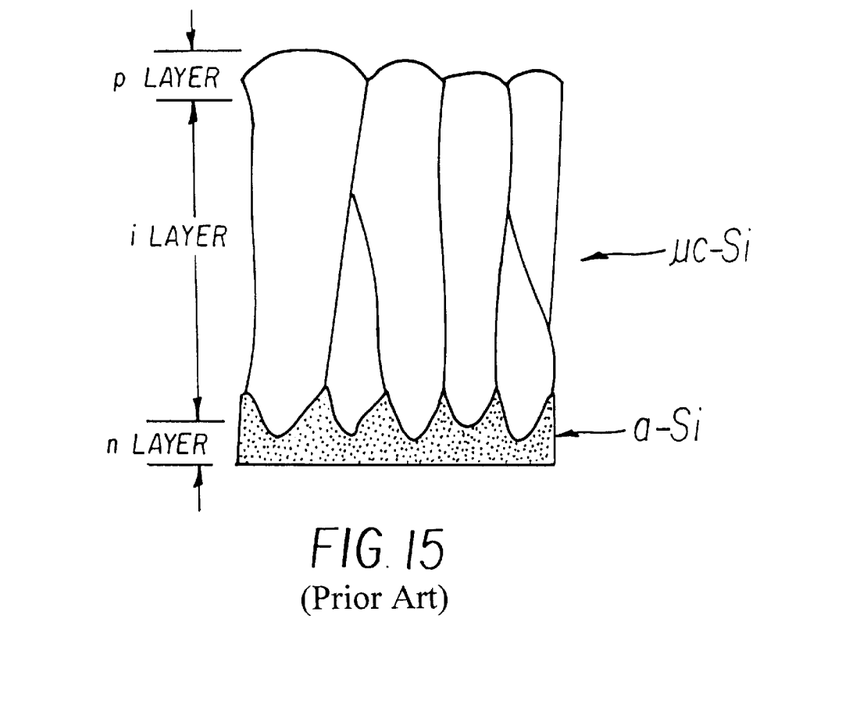
FIG. 15 is a conceptual drawing of a TEM photograph showing a section of a non-single-crystal solar cell according to the prior art.

However, in some conditions for producing the $\mu$c-Si film, an a-Si film may be formed at an initial stage of the film formation. FIG. 15 is a conceptual drawing of a transmission electron microscope (hereinafter referred to as TEM) photograph showing a section of a thin film solar cell that has been manufactured by laminating an n layer, an i layer and a p layer, in this order, at a substrate temperature of about 250° C. The magnification is about two hundred thousand. Although the conditions suitable for forming microcrystals during film formation are selected, an a-Si film is formed at the initial stage of the n layer formation, and an a-Si film is formed in some parts of the i layer.

The efficiency (hereinafter referred to as Eff) of this thin film solar cell was as low as 2.1%. The a-Si film at the initial stage of the film formation covered several 100 nm under some production conditions. It is therefore impossible to form the $\mu$c-Si film with the designed thickness.

The formation of even a thin a-Si film at the initial stage of the film formation increases defects and lowers the conductivity. This increases a resistance loss and lowers FF and Jsc. Moreover, the defect density of an interface between the a-Si film and the i layer of the $\mu$c-Si film increases to cause further deterioration of cell characteristics. If the layers are formed on a transparent substrate, sequentially from the light incidence side, the Jsc is lowered due to the large absorption coefficient of the initial a-Si film.

In an attempt to inhibit the formation of the non-crystalline film at the initial stage of film formation and to produce the $\mu$c-Si film (including microcrystals) on the i layer of a-Si from the beginning, the surface of the i layer is processed by a hydrogen plasma before the $\mu$c-Si film is formed. The effect of this method, however, has not yet been proved.

According to a report of Pellaton et. al., it is possible to form an n layer of $\mu$c-Si with a coating thickness of not greater than 10 nm for the purpose of forming a tunnel junction layer of a tandem cell by processing the surface of an i layer of a-Si with a carbon dioxide ($CO_2$) plasma. See pp. 651 of N. Pellaton Vaoucher, B. Rech, D. Fischer, S. Dubail, M. Goetz, H. Keppner, C. Beneking, O. Hadjadj, V. Shkllover and A. Shah, *Technical Digest of 9th Int. Photovoltaic Science and Engineering Conf.*, Miyazaki, Nov. 11–15, 1996.

This method, however, lacks controllability and repeatability, since it is difficult to control the composition, coating thickness, etc., of the layers that are formed on the interface by the $CO_2$ plasma. The above publication mentions the use of the a-Si layer as a substrate, but fails to disclose whether it is possible to use glass, a metal electrode and a transparent electrode as the substrate.

The inventor and his co-authors have used a pin-type cell, in which $\mu$c-Si was used for the p layer, and a p/i interface layer of an amorphous silicon oxide (a-SiO) was provided at an interface between the p layer and the i layer. According to their report, forming the p layer of $\mu$c-Si at a low temperature of about 85° C. prevents the formation of an a-Si film at the initial stage of the film formation and improves Voc, as compared with the case where a-SiO is used for the p layer. See T. Sasaki, S. Fujikake, K. Tabuchi, T. Yoshida, T. Hama, H. Sakai and Y Ichikawa, *J. Non-Cryst. Solids*, to be published; T. Sasaki, S. Fujikake, K. Tabuchi, T. Yoshida, T. Hama, H. Sakai and Y Ichikawa, *Tech. Digest of 11th Int. Photovoltaic Science and Engineering Conf.*, Sapporo. Japan, Sep. 20–24, 1999, to be published. They have also proposed forming the p layer of the $\mu$c-Si film with no initial a-Si film and setting the thickness of the a-SiO in the p/i interface layer within an appropriate range to develop a thin film solar cell with a higher efficiency than the case in which a-SiO is used for the p layer. The above structure, however, is only applicable to the case where the a-SiO is formed as an interface layer on the a-Si film. It is not applicable to the case where the substrate is formed of glass, a metal electrode or a transparent electrode at a low temperature.

Figure 16:
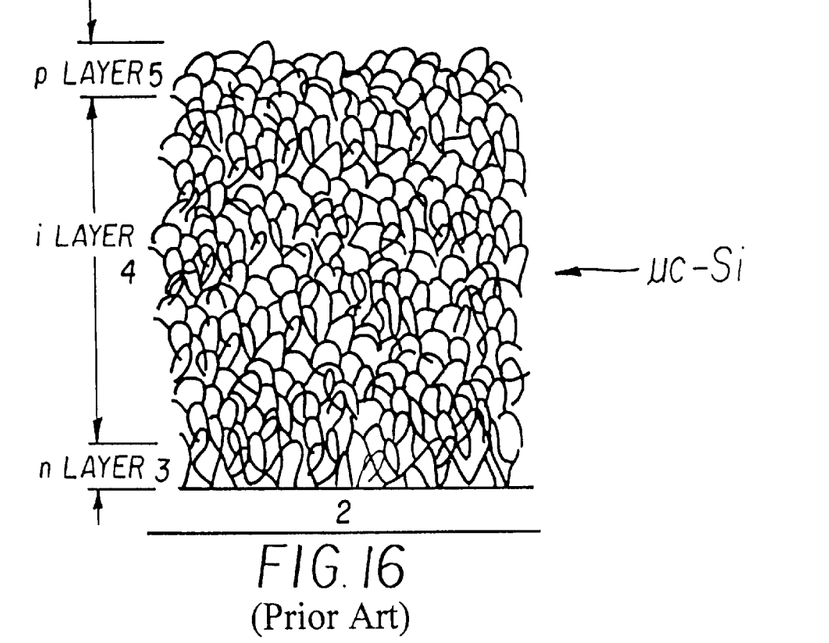
FIG. 16 is a conceptual drawing of a TEM photograph showing a section of another prior art non-single-crystal solar cell.

The inventor has now conducted the same experiment with the condition that the substrate was formed of glass, a metal electrode or a transparent electrode. FIG. 16 is a conceptual drawing of a TEM photograph showing a section of a solar cell that is manufactured by laminating an n layer 3, i layer 4 and p layer 5 of $\mu$c-Si, in this order, on a lower electrode 2 of metal film at a substrate temperature of about 85° C.

Although microcrystals are formed in the initial stage of the film formation due to the low substrate temperature, the crystal grain size is small over the entire cell. Therefore, the Eff of the cell was 1.5%. This is lower than the Eff in the case where the layers are laminated at the substrate temperature of 250° C., as shown in FIG. 15. As previously stated, the formation of a mc-Si film at high temperature results in the formation of a noncrystalline film at the initial stage of film formation. This formation of the non-crystalline film badly affects the cell characteristics in such a manner as to lower FF, Jsc, and the like. Further, even if a low substrate temperature were used to form microcrystals from the initial stage of the film formation, the resulting cell characteristics still deteriorate due to the small crystal grain size produced over the entire cell area.

It is therefore an object of the present invention to provide a non-single-crystal thin film solar cell manufacturing method, which prevents the formation of non-crystalline film at the initial stage of the film formation, maintains a large grain size of microcrystals and improves the total cell efficiency without causing deterioration of characteristics such as FF and Jsc.

SUMMARY OF THE INVENTION

The above object can be accomplished by providing a method of manufacturing a non-single-crystal thin film solar cell, which comprises laminating together (a) a first-conductivity-type layer comprising mainly microcrystalline phases, (b) a substantially-intrinsic i-type semiconductor layer composed mainly of microcrystalline phases, and (c) a second-conductivity-type layer of a reverse-conductivity-type to the first-conductivity-type layer, to form a lamination layer comprising mainly microcrystalline phases, on a substrate coated with conductive film, and forming a transparent electrode and a metal grid electrode, the method comprising the steps of: (1) forming a part of the lamination layer at a first substrate temperature, and (2) forming the rest of the laminate thereon at a second substrate temperature higher than the first substrate temperature.

The above object can also be accomplished by providing a method of manufacturing a non-single-crystal thin film solar cell, which comprises laminating together (a) a first-conductivity-type layer composed mainly of microcrystalline phases, (b) a substantially-intrinsic i-type semiconductor layer composed mainly of microcrystalline phases and (c) a second-conductivity-type layer of a reverse-conductivity-type to the first-conductivity-type layer, to form a lamination layer comprising mainly microcrystalline phases, on a transparent substrate coated with conductive transparent film, and forming a metal electrode, the method comprising the steps of: (1) forming a part of the lamination layer at a first substrate temperature, and (2) forming the rest of the lamination layer thereon at a second substrate temperature higher than the first substrate temperature.

In one preferred form of the present invention, the first-conductivity-type layer is formed at the first substrate temperature, and the i type semiconductor layer is then formed at the second substrate temperature higher than the first substrate temperature. In another preferred mode of the present invention, a part of the first-conductivity-type layer is formed at the first substrate temperature, the rest of the first-conductivity-type layer is formed at the second substrate temperature higher than the first substrate temperature, and the i type semiconductor layer is then formed at a higher substrate temperature than the first substrate temperature.

In another preferred form of the present invention, the first-conductivity-type layer is formed at a lower substrate temperature than the second substrate temperature, a part of the i-type semiconductor layer is formed at the first substrate temperature, and the rest of the i-type semiconductor layer is formed at the second substrate temperature higher than the first substrate temperature.

The above object can also be accomplished by providing a method of manufacturing a non-single-crystal thin film solar cell, which comprises laminating together a first-conductivity-type layer composed mainly of microcrystalline phases and a second-conductivity-type layer of a reverse-conductivity-type to the first-conductivity-type layer, to form a lamination layer comprising mainly microcrystalline phases, on a substrate coated with conductive film, and forming a transparent electrode and a grid electrode, the method comprising the steps of: (a) forming a part of the lamination layer at a first substrate temperature, and (b) forming the rest of the lamination layer thereon at a second substrate temperature higher than the first substrate temperature.

In one preferred mode of the present invention, (a) the first-conductivity-type layer and a part of the second-conductivity-type layer is formed at a first substrate temperature lower than the second substrate; and (b) the rest of the second-conductivity-type layer is then formed at the second substrate temperature, which is higher than the first substrate temperature.

BRIEF DESCRIPTION OF THE DRAWINGS

The invention will be described in greater detail with reference to certain preferred embodiments thereof and the accompanying drawings, wherein.

DETAILED DESCRIPTION OF THE PREFERRED EMBODIMENTS

A silicon hydride of material gas is preferably diluted by hydrogen to form a $\mu c$ film. For example, $\mu c$-Si may be produced by a plasma CVD method, a heat CVD method, a light CVD method, etc. Hydrogen atoms are believed to activate the surface of the formed film and etch the film at the same time. The etching rate of a-Si is higher than that of $\mu c$-Si. The lower the temperature is, the higher the etching rate is. See, e.g., pp. 651 of H. N. Wanka and M. B. Schubert, Mat. Res. Soc. Symp. Proc., 467, 1997.

Therefore, if the microcrystalline film is formed at a low temperature, the etching effect is increased to substantially prevent the formation of an a-film at the initial stage of film formation. Only the $\mu c$-film is formed as a result. Once the surface is covered with the $\mu c$ film, the microcrystalline film grows with the $\mu c$-film being a core. This inhibits the formation of non-crystalline film and enables the formation of microcrystalline film with excellent crystallinity. The increase in film forming temperature increases the crystal grain size, thus improving the crystallinity and the photoelectric characteristics of the film. If microcrystals are produced at a low temperature at the initial stage of the film formation and a microcrystalline film is formed at a higher temperature, an annealing effect improves the crystallinity of the microcrystalline film at the initial stage of the film formation.

This effect also applies to the manufacture of a non-single-crystal thin film solar cell, which comprises laminating together (1) a first-conductivity-type layer comprising mainly microcrystalline phases and (2) a second-conductivity-type layer of a reverse-conductivity-type to the first-conductivity-type layer, on a substrate through conductive film, and forming a metal electrode.

In the case of a non-single-crystal thin film solar cell having an i-type semiconductor layer, the i-type semiconductor layer is made of silicon or a silicon alloy, such as a silicon germanium alloy. The following embodiments show that a desired effect can be achieved by using an i-type semiconductor layer made of silicon. The same effect can be achieved by using a silicon alloy, such as a silicon germanium alloy. Such silicon alloys have properties similar to those of silicon and exhibit both a small band gap and a large absorption power. In a particularly preferred mode of the present invention, at least a part of the change from the first substrate temperature to the second substrate temperature is made continuously while the layers are being formed. This improves cell efficiency, and shortens cell production time.

Preferably, the first substrate temperature is not less than about 70° C., but less than about 120° C. Film formation at a substrate temperature of about 70° C.–120° C. improves the etching effect and substantially prevents the formation of an initial a-film. This results in the formation of the desired $\mu c$-film including microcrystals from the initial stage of film formation. At a temperature lower than about 70° C., the excessive etching effect disturbs the formation of the $\mu c$-film. At a temperature higher than about 120° C., the a-film remains due to an insufficient etching effect.

Also, preferably, the second substrate temperature is not less than about 120° C. but less than about 450° C. Once the surface of the substrate is covered with the $\mu c$-film, the microcrystalline film grows, with the $\mu c$-film being a core at a higher temperature. With the increase in the substrate temperature, the crystal grain size increases to improve the crystallinity and photoelectric characteristics. If the film were formed at a temperature of less than about 120° C., the crystal grains could not be grown sufficiently. If the film were formed at a temperature higher than about 450° C., microcrystals form due to the excessive generation of cores.

The first-conductivity-type layer and the second-conductivity-type layer are preferably made of silicon or a silicon alloy, such as a silicon oxide, a silicon carbide or a silicon nitride. The following embodiments show that a desired effect can be achieved by using a first-conductivity-type layer and a second-conductivity-type layer made of silicon. The same effect can be achieved by using a silicon alloy, such as a silicon oxide, a silicon carbide, or a silicon nitride. Such alloys have properties similar to those of silicon and exhibit a large band gap and a small absorption power. Further, the second-conductivity-type layer may be either $\mu c$-film or a-film.

Some of the preferred embodiments of the present invention will now be described in detail with reference to the accompanying drawings:

First Embodiment

Figure 2:
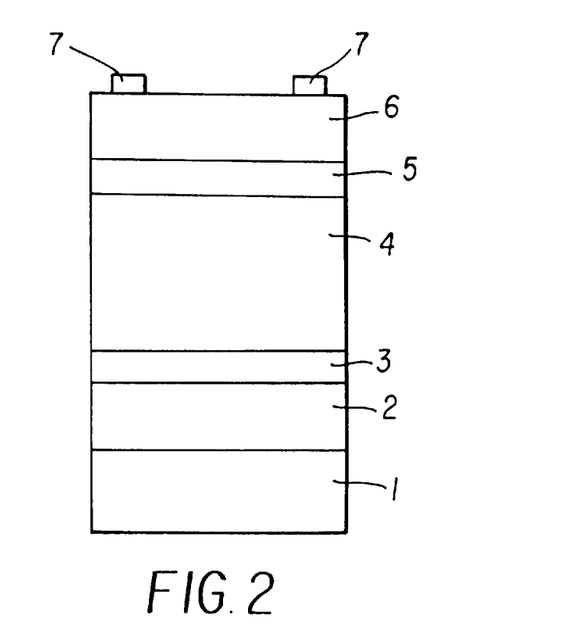
FIG. 2 is a cross-sectional view showing a non-single-crystal solar cell according to a first embodiment.

A description will be given here of the experimental manufacture of a solar cell that is comprised mainly of $\mu c$-Si. FIG. 2 is a cross-sectional view of a non-single-crystal thin film solar cell according to the first embodiment of the present invention. A description will now be given of a process for manufacturing it.

A glass substrate 1 is used as a substrate. A silver (Ag) film with a coating thickness of 100–200 nm is formed as a metal electrode 2 by a sputtering method. Another metal film such as aluminum may also be used. The film may also be formed by deposition.

Figure 1:
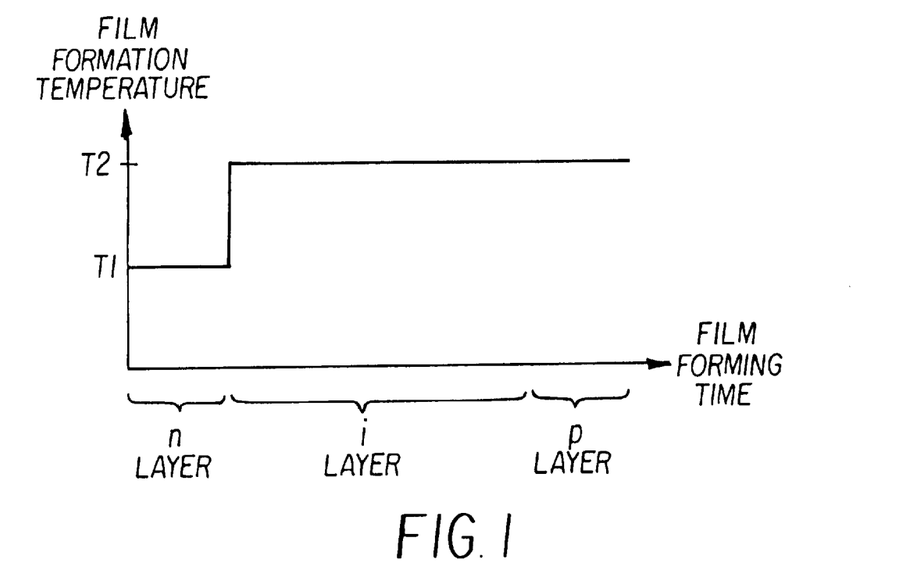
FIG. 1 is a program scheme of the temperature during the formation of a film for a non-single-crystal solar cell according to a first embodiment of the present invention.

Then, an n layer 3 as a first-conductivity-type layer, an i layer 4 of $\mu c$-Si, and a p layer 5 of $\mu c$-Si are sequentially formed by the plasma CVD method. FIG. 1 is a program scheme for the temperature during film formation. The n layer 3 is formed at a low substrate temperature T1 of about 70–120° C., and the i layer 4 and the p layer 5 are formed at a substrate temperature T2, which is higher than T1. According to the present embodiment, T1 is about 100° C., and T2 is about 250° C. The pressure is between about 13 Pa and 650 Pa.

First, the n layer 3 of $\mu c$-Si with a coating thickness of about 10–50 nm is formed by using a mixed gas. The mixed gas is composed of mono-silane gas (hereinafter referred to as SiH$_4$) of 1–200 ml/min, phosphene gas (hereinafter referred to as PH$_3$) of 0.1–20 ml/min, and hydrogen (hereinafter referred to as H$_2$) of 100–2000 ml/min. Then, the i layer 4 μc-Si with a coating thickness of 500–5000 nm is formed by using a mixed gas comprising SiH$_4$ gas of about 1–200 ml/min and H$_2$ gas of about 10–2000 ml/min. Then, the p layer 5 of μc-Si with a coating thickness of 10–50 nm is formed by using a mixed gas comprising SiH$_4$ gas of 1–200 ml/min, diborane gas (hereinafter referred to as B$_2$H$_6$) of 1–200 ml/min, and H$_2$ gas of 100–2000 ml/min. The film forming speed is about 0.5–2 nm/min, although the speed depends on the quantity of gas used and the amount of electric power applied.

Next, a transparent electrode 6 is formed by the sputtering method. More specifically, an indium tin oxide (hereinafter referred to as ITO) at a coating thickness of about 60–80 nm is formed. Zinc oxide (ZnO), etc., may also be used for the transparent electrode 6. The transparent electrode 6 may also be formed by deposition. Finally, a metal grid electrode 7 is formed on the transparent electrode 6.

It is important to form the n layer 3 of μc-Si within a temperature range between about 70° C. and 120° C. When the temperature was higher than 120° C., the formation of a non-crystalline layer at the initial stage of the film formation was observed through an electron microscope, and the quality characteristics of a cell made with such a μc-Si was lowered. On the other hand, the formation of a non-crystalline thin film at a temperature lower than about 120° C. improves the etching effect. This substantially prevents the formation of non-crystalline film at the initial stage of film formation, and results in the formation of only a microcrystalline thin film. When the temperature used was lower than about 70° C., the formation of vacancies in the microcrystalline thin film was observed through a transmission electron microscope, and cell characteristics deteriorated. Forming the film within a temperature range of between about 70° C. and 120° C. prevents the formation of vacancies and the generation of a non-crystalline layer at the initial stage of the film formation.

According to this embodiment, there is no transition layer, which causes a problem, since the substrate temperature is low. Actually, the section was confirmed through the transmission electron microscope. The percentage content of the microcrystalline layer is not less than about 80%.

Figure 3:
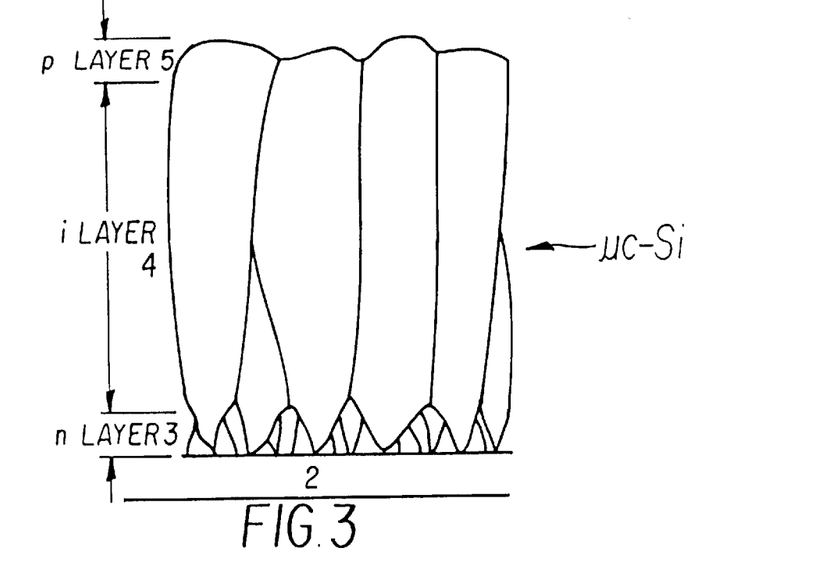
FIG. 3 is a conceptual drawing of a TEM photograph showing a non-single-crystal solar cell according to a first embodiment.

FIG. 3 is a conceptual drawing of a TEM photograph showing a cross section of a non-single-crystal single-crystal thin film solar cell. The magnification is about two hundred thousand.

As is clear from FIG. 3, there is no a-Si film at the initial stage of film formation, seen in FIG. 15, and the n layer 3 of μc-Si is directly grown on metal electrode 2. The i layer 4 and the p layer 5, which are formed at a substrate temperature of about 250° C., have large crystal grains. The i layer 4 and the p layer 5 are substantially polycrystalline films with only an extremely small amount of a-Si phase remaining at the grain boundary.

Figure 14:
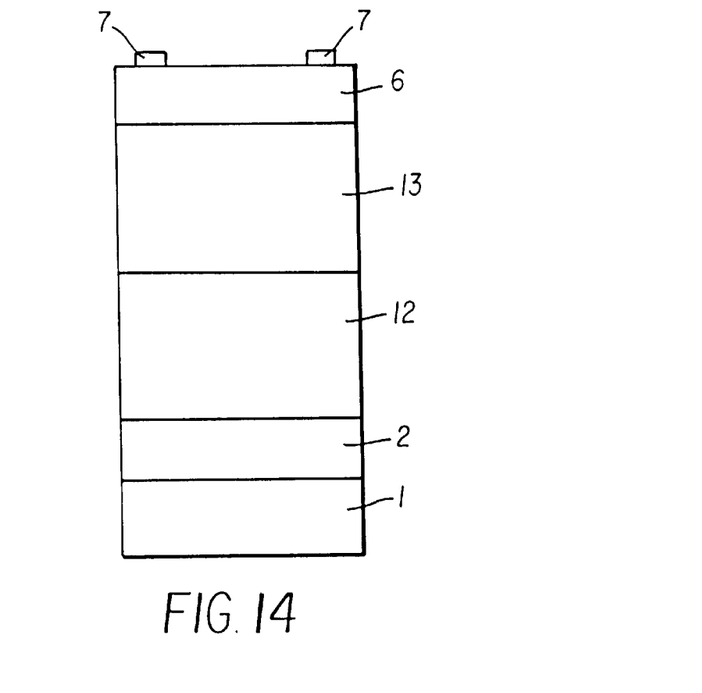
FIG. 14 is a cross-sectional view showing the seventh non-single-crystal thin film solar cell that is manufactured by the method of the invention.

The efficiency of this cell was 5.2%, which is significantly higher than the 2.1% of the cell seen in FIG. 14, which was manufactured at a substrate temperature of about 250°.

Second Embodiment

Figure 4:
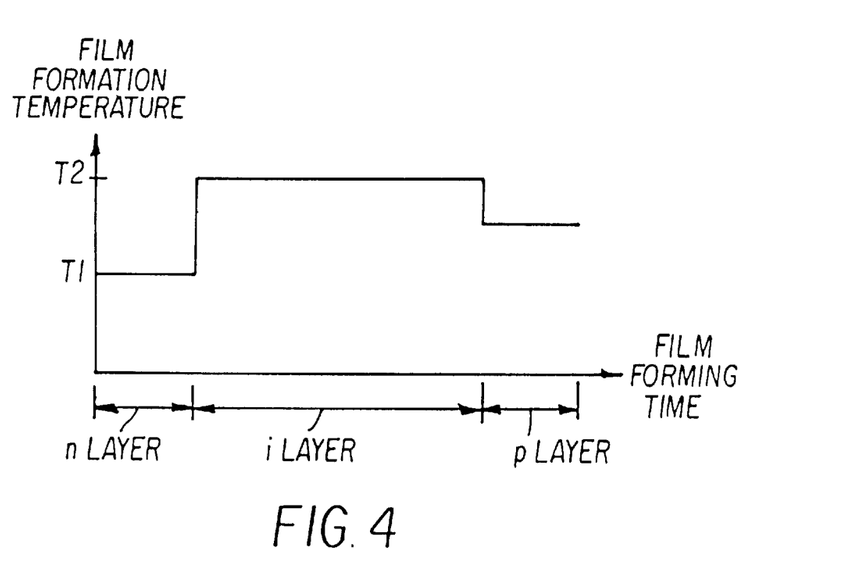
FIG. 4 is a program scheme of the temperature during the formation of a film for a non-single-crystal solar cell according to a second embodiment of the present invention.
Figure 5:
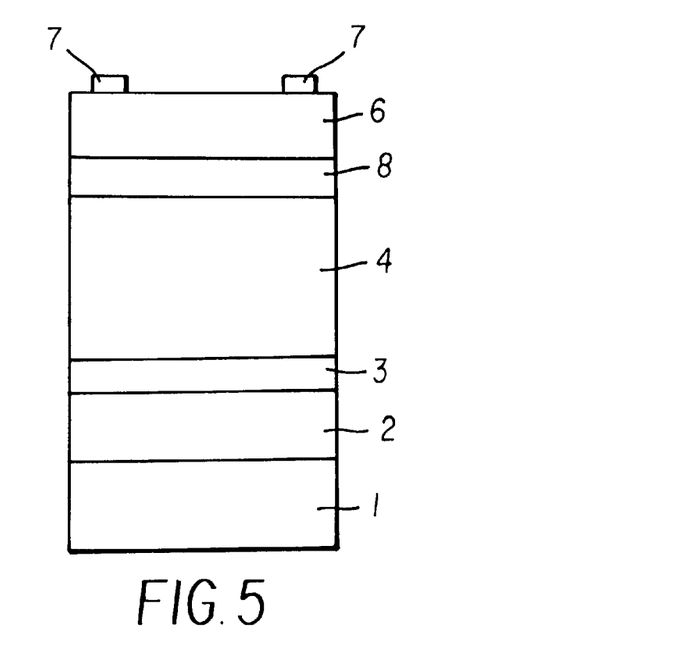
FIG. 5 is a cross-sectional view showing a non-single-crystal solar cell according to a second embodiment.

FIG. 4 is a temperature program scheme showing the substrate temperature during film formation in a manufacturing method according to a second embodiment of the present invention. FIG. 5 is a cross-sectional view showing a non-single-crystal thin film solar cell that is manufactured by this method.

As is the case with the first embodiment, the n layer 3 of μc-Si is formed at about 100° C., and the i layer 4 of μc-Si is formed at about 250° C. According to the present embodiment, however, a p layer 8 of a-SiO is then formed on the i layer 4 of μc-Si at about 200° C.

A microcrystalline film is formed in this cell from the initial stage of the film formation. The efficiency Eff of the cell is 5.6%, since the use of a-SiO for the p layer 8 increases the band gap and Jsc, as compared with the case where the p layer of μc-Si is used.

Third Embodiment

Figure 6:
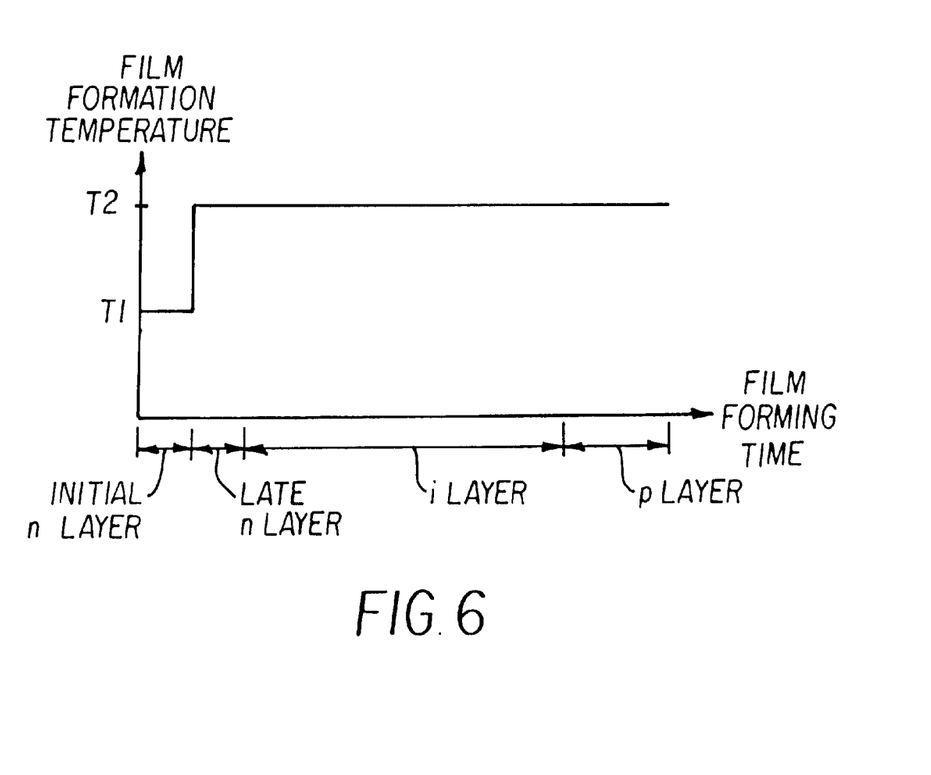
FIG. 6 is a program scheme of the temperature during the formation of a film for a non-single-crystal solar cell according to a third embodiment of the present invention.
Figure 7:
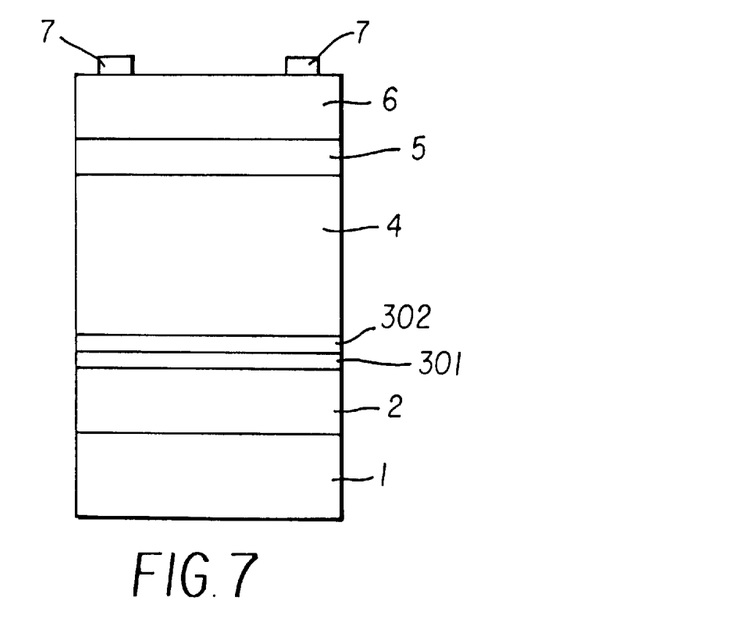
FIG. 7 is a cross-sectional view showing a non-single-crystal solar cell according to a third embodiment.

FIG. 6 is a temperature program scheme showing the substrate temperature during film formation in a manufacturing method according to a third embodiment of the present invention. FIG. 7 is a cross-sectional view showing a non-single-crystal thin film solar cell that is manufactured by this method.

As is the case with the first embodiment, the metal electrode 2 is formed on the glass substrate 1. According to this embodiment, however, the substrate temperature is changed from T1 to T2 when the n layer of μc-Si, as the first-conductivity-type layer, is formed on a metal electrode 2. T1 is between about 70° C. and 120° C., and T2 is higher than T1. Particularly, according to the present embodiment, T1 is about 70° C. and T2 is about 250° C.

In FIG. 7, the n layer formed at T1 is represented as an initial n layer 301, and the n layer formed at T2 is represented as a late n layer 302. The i layer 4 of μc-Si and the p layer 5 of μc-Si are formed at about 250° C.

This cell is substantially microcrystalline from the initial stage of film formation. The efficiency Eff of the cell is 4.8%. The reason why the Eff is slightly lower than the non-single-crystal solar cell of the first embodiment is as follows. Due to the thin initial n layer 301 formed at T1 and the insufficient growth of the microcrystalline grains, the metal electrode 2 is not entirely covered with microcrystals, and there still remains the a-Si film. According to the present embodiment, the i layer is formed at about 250° C., but the i layer need not necessarily be formed at the same temperature as T2, at which the late n layer is formed.

Fourth Embodiment

Figure 8:
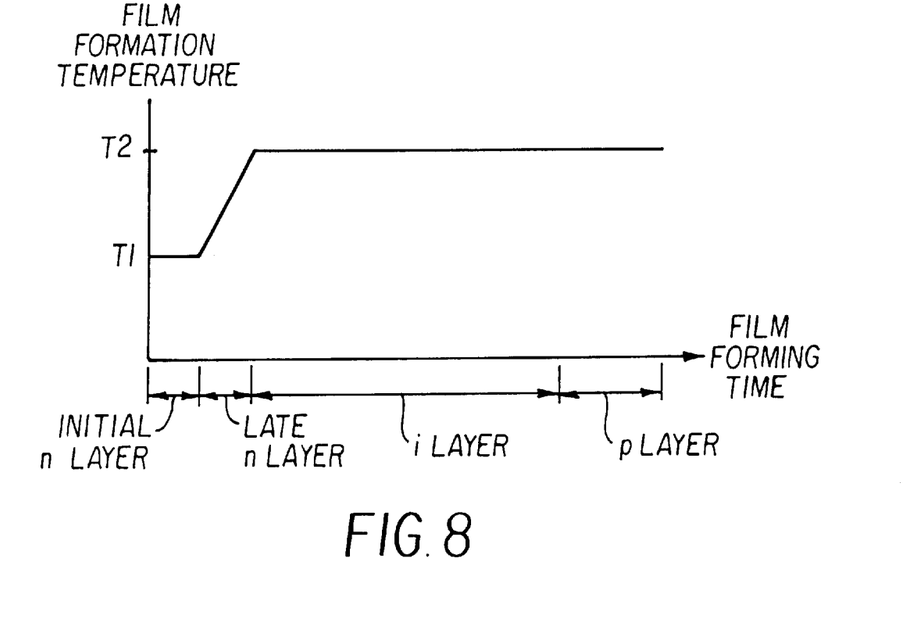
FIG. 8 is a program scheme of the temperature during the formation of a film for a non-single-crystal solar cell according to a fourth embodiment of the present invention.
Figure 9:
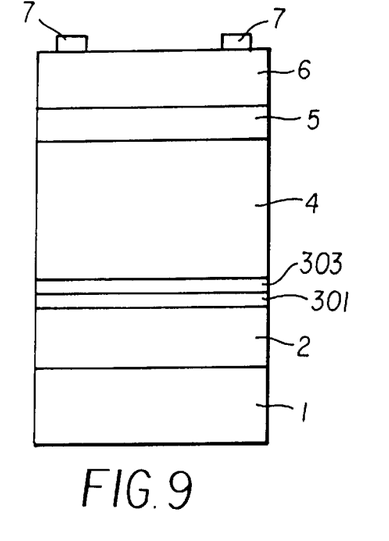
FIG. 9 is a cross-sectional view showing a non-single-crystal solar cell according to a fourth embodiment.

FIG. 8 is a temperature program scheme showing the substrate temperature during film formation in a manufacturing method according to a fourth embodiment of the present invention. FIG. 9 is a cross-sectional view showing a non-single-crystal thin film solar cell that is manufactured by this method.

As is the case with the third embodiment, the substrate temperature is changed from T1 to T2 during the formation of the n layer of μc-Si as the first-conductivity-type layer, and the n layer is composed of an initial n layer 303 formed at a low temperature and a late n layer 303. The fourth embodiment is different from the third embodiment in that the initial n layer 301 is formed at T1=about 100° C., and the late n layer 303 is then formed while the substrate temperature is continuously changed from about T1=100° C. to about T2=250° C.

The continuous change of the substrate temperature enables the smooth and continuous formation of the late n layer 303. This cell was substantially microcrystalline from the initial stage of the film formation, and the efficiency Eff of the cell was 5.2%.

If the substrate temperature is changed step by step as is the case with the second embodiment, it is necessary to suspend film formation until the substrate temperature reaches T2. According to the present embodiment, however, it is possible to continuously form the film and form the cell within a shorter period of time.

According to the present embodiment, the temperature is changed linearly, but the present invention should not be restricted to this. The temperature may be changed in a variety of patterns.

Fifth Embodiment

Figure 10:
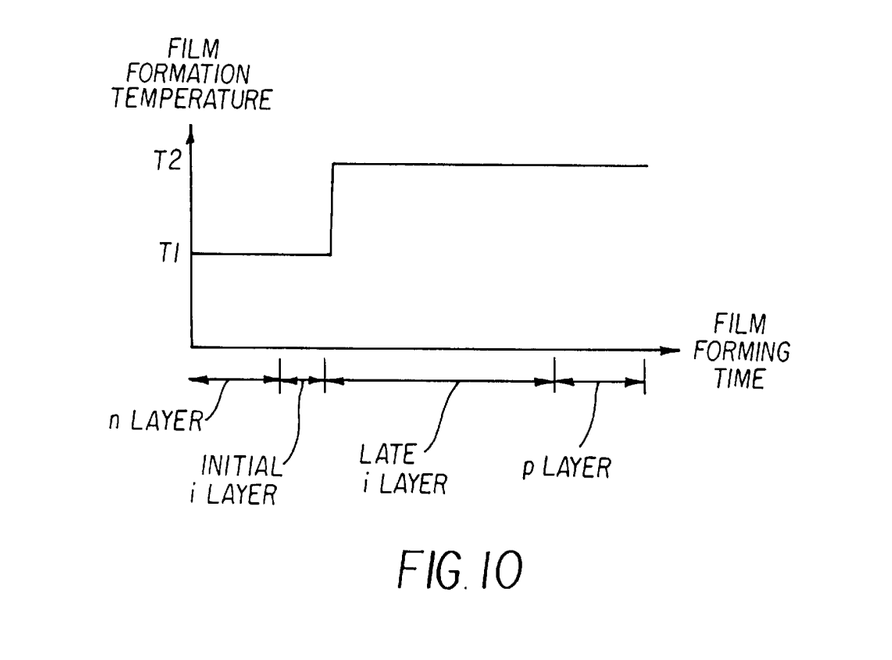
FIG. 10 is a program scheme of the temperature during the formation of a film for a non-single-crystal solar cell according to a fifth embodiment of the present invention.
Figure 11:
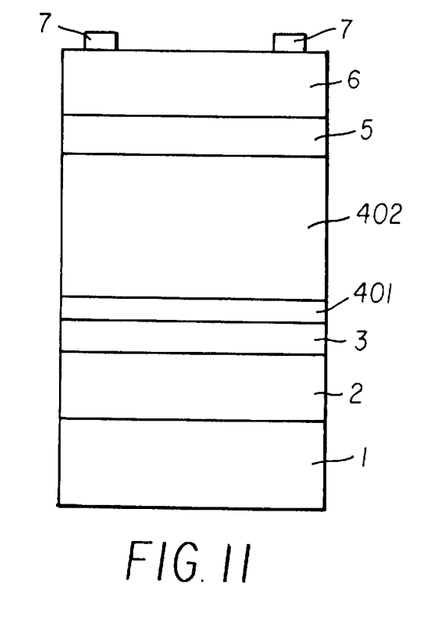
FIG. 11 is a cross-sectional view showing a non-single-crystal solar cell according to the fifth embodiment.

FIG. 10 is a temperature program scheme showing the substrate temperature during film formation in a manufacturing method according to the present invention. FIG. 11 is a cross-sectional view showing a fifth non-single-crystal thin film solar cell that is manufactured by this method.

As was the case with the first embodiment, the metal electrode 2 is formed on the glass substrate 1, and the n layer 3 of µc-Si is formed as the first-conductivity-type layer at substrate temperature T1. The fifth embodiment is different from the first embodiment in that the i layer 3 of µc-Si is formed on the n layer 4 while the substrate temperature is increased from T1 to T2. T1 is in the range between about 70° C. and 120° C., and T2 is higher than T1. In particular, according to the present embodiment, about T1 is 100° C. and T2 is about 250° C. According to the present embodiment, an initial i layer is formed at the same temperature as T1, but the forming temperature for the n layer should not necessarily be the same as the forming temperature for the initial i layer.

In FIG. 11, the i layer at T1 is represented as an initial i layer 401, and the i layer at T2 is represented as a late i layer 402. The p layer 5 of µc-Si is formed on the i layer at about 250° C. According to the present embodiment, the p layer 5 is formed at about 250° C., but the forming temperature for the p layer 5 need not necessarily be the same as T2.

This cell was microcrystalline from the initial stage of film formation. The efficiency Eff of the cell was 6.4%.

Sixth Embodiment

Figure 12:
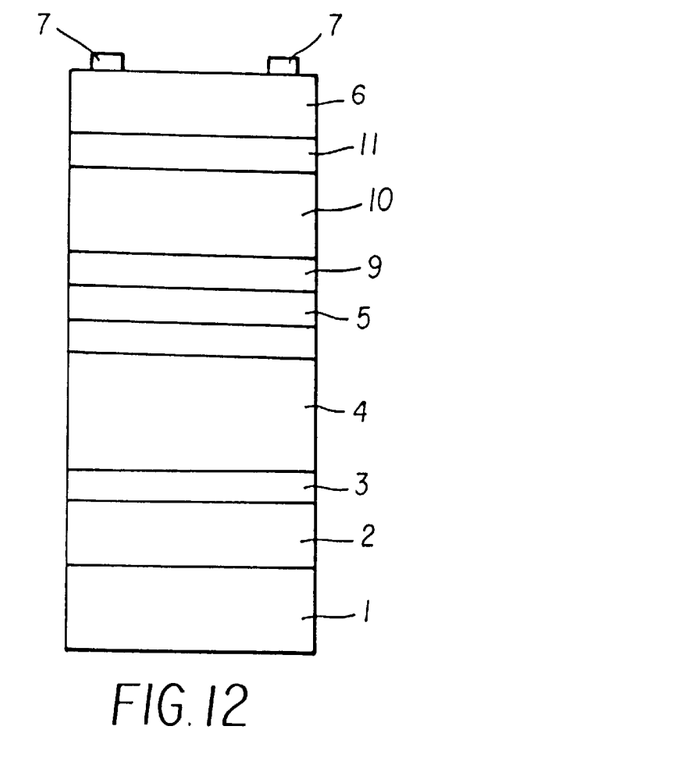
FIG. 12 is a cross-sectional view showing a sixth non-single-crystal thin film solar cell that is manufactured by a method according to the present invention.

FIG. 12 is a cross-sectional view showing a sixth non-single-crystal thin film solar cell that is manufactured by a method according to the present invention. As in the case with the first embodiment, an n layer 3 of µc-Si, an i layer 4 of µc-Si and a p layer 5 of µc-Si are sequentially formed at about 100° C., 250° C. and 250° C., respectively. The sixth embodiment is different from the first embodiment in that an n layer 9 of a-Si, an i layer of a-Si and a p layer 11 of a-SiO are sequentially formed on the p layer 5 at about 200° C. This results in the formation of a two-layered tandem cell, and achieves a more excellent conversion efficiency than a single cell. The n layer 3, i layer 4 and p layer 5 of µc-Si operate as a bottom cell, whereas the n layer 9, i layer 10 and p layer 11 of a-Si operate as a top cell. The efficiency Eff of the cell was 9.5%.

The efficiency can be further improved if the substrate temperature is changed during film formation to divide the i layer of µc-Si in the bottom cell into an initial i layer at a low temperature and a late i layer at a high temperature, as is the case with the fifth embodiment. The substrate temperature may continuously be changed from T1 to T2.

In the above descriptions, the n layer, the i layer and the p layer are sequentially laminated on the substrate, but it is needless to say that the same effect can be achieved by sequentially laminating the p layer, the i layer and the n layer. It is preferable to use a µc-Si alloy, such as µc-SiGe, in order to achieve a higher long-wavelength absorption coefficient than µc-Si.

If light strikes a cell of the invention through a transparent substrate, either the µc-Si mentioned in the above descriptions or the µc-Si alloy with a higher translucency than the µc-Si may be used as the first-conductivity-type layer. Examples of the µc-Si alloy are µc-SiO, µc-SiC and µc-SiN.

Seventh Embodiment

Figure 13:
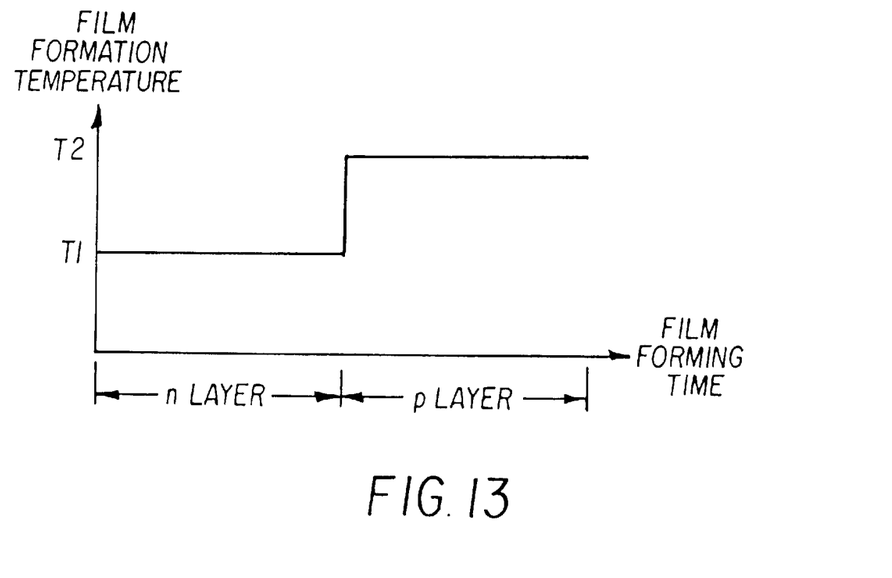
FIG. 13 is a program scheme of the temperature during the formation of a film for non-single-crystal solar cell according to a seventh embodiment of the present invention.

FIG. 13 is a temperature program scheme showing the substrate temperature during film formation in a manufacturing method according to the present invention. FIG. 14 is a cross-sectional view showing a seventh non-single-crystal thin film solar cell that is manufactured by this method.

According to the present embodiment, a cell is of a pn type, rather than the pin type in the above embodiments. The manufacturing method will be described as follows:

A silver (Ag) film with a coating thickness of about 100–200 nm is formed as a metal electrode 2 on a glass substrate 1 by a sputtering method. It is possible to use another metal film, such as an aluminum film, and use another method such as a deposition method.

Then, an n layer 12 of µc-Si as the first-conductivity-type layer and a p layer 13 of µc-Si as the second-conductivity-type layer are sequentially formed by the plasma CVD method. During the formation of the n layer 12, the substrate temperature is maintained at a low temperature T1 of about 70° C.–120° C. The p layer 13 is formed at a substrate temperature T2 higher than T1. According to the present embodiment, T1 is about 100° C., and T2 is about 250° C. The pressure is between about 13 Pa and 650 Pa.

The n layer 12 of µc-Si with a coating thickness of about 500–5000 nm is formed by using a mixed gas that is composed of $SiH_4$ gas of 1–200 ml/min, $PH_3$ gas of 0.1–20 ml/min, and $H_2$ of 100–2000 ml/min. Then, the p layer 13 of µc-Si with a coating thickness of about 500–5000 nm is formed by using a mixed gas that is composed of $SiH_4$ gas of 1–200 ml/min, $B_2H_4$ gas of 0.1–20 ml/min, and $H_2$ of 100–2000 ml/min at a substrate temperature of about 250° C.

Next, a transparent electrode 6 is formed by a sputtering method. More specifically, an ITO film with a coating thickness of about 60–80 nm is formed. ZnO, etc. may be used for the transparent electrode 6. The transparent electrode 6 may also be formed by deposition. Finally, a metal grid electrode 7 is formed on the transparent electrode 6.

The pn type cell becomes microcrystalline and increases its crystal grain size from the beginning of the film formation. The pn type cell has desirable cell characteristics with an efficiency Eff of 4.5%.

The pn type cell achieves desirable cell characteristics if the initial n layer of the first-conductivity-type layer is formed at a low substrate temperature T1 of about 70–120° C., the late n layer of the first-conductivity-type layer is formed at a high substrate temperature T2 of about 250° C., and the second-conductivity-type layer is formed thereon as is the case in the second embodiment.

The pn type cell achieves desirable cell characteristics if the initial p layer of the first-conductivity-type layer and the second-conductivity-type layer are formed at a low substrate temperature T1 of about 70–120° C., and the late n layer of the first-conductivity-type layer is then formed at a high substrate temperature T2. The substrate temperature may be changed continuously from T1 to T2.

According to the present embodiment, the n layer 12 and the p layer 13 are laminated in this order, but the same effect can be achieved by laminating the p layer and the n layer in this order. The present embodiment is related to a substrate type solar cell having a transparent substrate, such as a glass substrate. However, the same effect can be achieved by applying µc-Si in the case where an opaque substrate is used.

The present invention may also be applied to a solar cell with a transparent substrate, through which the light passes. Particularly in this case, a microcrystalline silicon alloy, such as µc-SiO, µc-SiC or µc-SiN, which has a higher translucency than the µc-Si, is preferably used as the first-conductivity-type layer (µc film) composed mainly of microcrystalline phases.

As set forth above, the method of manufacturing a non-single-crystal thin film solar cell according to the present invention, which comprises laminating together a first-conductivity-type layer comprising mainly microcrystalline phases, a substantially-intrinsic i-type semiconductor layer comprising mainly microcrystalline phases, and a second-conductivity-type layer of a reverse-conductivity-type to the first-conductivity-type layer, to form a lamination layer comprising mainly microcrystalline phases, on a substrate coated with conductive film, and then forming a transparent electrode and a metal grid electrode, is characterized by comprising the steps of: (1) forming a part of the lamination layer at a first substrate temperature, and (2) forming the rest of the laminate thereon at a second substrate temperature higher than the first substrate temperature. This prevents the generation of non-crystalline phases and the poor growth of microcrystals, which occur in the case where the film is formed at a single substrate temperature. This significantly improves the Eff.

The method may comprise the steps of forming the first-conductivity-type layer at the first substrate temperature, and forming the i-type semiconductor layer at the second substrate temperature higher than the first substrate temperature. Alternatively, the method may comprise the steps of forming the first-conductivity-type layer at the first substrate temperature; forming the rest of the first-conductivity-type layer at the second substrate temperature higher than the first substrate temperature; and forming the i type semiconductor layer at a higher substrate temperature than the first substrate temperature. Alternatively, the method may comprise the steps of forming the first-conductivity-type layer at a lower substrate temperature than the second substrate temperature; forming a part of the i-type semiconductor layer at the first substrate temperature; and forming the rest of the i-type semiconductor layer at the second substrate temperature higher than the first substrate temperature.

Preferably, the first substrate temperature is between about 70° C. and 120° C., and the second substrate temperature is between about 120° C. and 450° C. This prevents the generation of non-crystalline layers at the initial stage of the film formation.

Once the surface of the substrate is covered with the microcrystalline layer, the non-crystalline layer is never formed because the microcrystalline layer serves as a core. The microcrystalline film with excellent crystallinity is formed on the microcrystalline layer, and the crystal grain size is increased. This improves the crystallinity and the photoelectric characteristics of the cell. The microcrystalline layer at the initial stage of film formation is annealed at a higher temperature than the film forming temperature, and this results in the growth of microcrystal grains to improve the efficiency of the cell.

At least a part of the change from the first substrate temperature to the second substrate temperature is continuous, and the film is formed during the continuous change in temperature. This improves the efficiency of the cell and shortens the cell producing time.

The present invention is also effective for a non-single-crystal thin film solar cell, which light strikes through a transparent substrate. The efficiency of the cell is improved by forming the film at a first substrate temperature and then a second substrate temperature higher than the first substrate temperature. Therefore, the present invention is a very important invention related to the structure and the manufacturing method of the non-single-crystal thin film solar cell with a high efficiency.

It should be understood, however, that there is no intention to limit the invention to the specific forms disclosed. On the contrary, the invention is intended to cover all modifications, alternate constructions and equivalents falling within the spirit and scope of the description of the invention and as expressed in the appended claims.

What is claimed is:

1. A method of manufacturing a non-single-crystal silicon or silicon alloy thin film solar cell, which comprises laminating together (a) a first-conductivity-type layer comprising mainly microcrystalline phases, (b) an intrinsic i-type semiconductor layer comprising mainly microcrystalline phases, and (c) a second-conductivity-type layer of a reverse-conductivity-type to said first-conductivity-type layer, to form a lamination layer comprising mainly microcrystalline phases, on a substrate coated with a conductive film, and forming a transparent electrode and a metal grid electrode, said method comprising the steps of:

forming a first part of said lamination layer at a first substrate temperature that prevents formation of amorphous phase at an initial stage of film formation, and forming the rest of said lamination layer thereon at a second substrate temperature higher than said first substrate temperature that (a) increases crystal grain size to improve crystallinity and photoelectric characteristics of the film, and (b) anneals the first part of said lamination layer.

2. A method of manufacturing a non-single-crystal silicon or silicon alloy thin film solar cell, which comprises laminating together (a) a first-conductivity-type layer comprising mainly microcrystalline phases, (b) an intrinsic i-type semiconductor layer comprising mainly microcrystalline phases, and (c) a second-conductivity-type layer of a reverse-conductivity-type to said first-conductivity-type layer, to form a lamination layer comprising mainly microcrystalline phases on a transparent substrate coated with a conductive transparent film, and forming a metal electrode, said method comprising the steps of:

forming a first part of said lamination layer at a first substrate temperature that prevents formation of amorphous phase at an initial stage of film formation, and forming the rest of said lamination layer thereon at a second substrate temperature higher than said first substrate temperature that (a) increases crystal grain size to improve crystallinity and photoelectric characteristics of the film, and (b) anneals the first part of said lamination layer.

3. A method of manufacturing a non-single-crystal thin film solar cell according to claim 2, comprising the steps of:

forming said first-conductivity-type layer at said first substrate temperature, which is about 70° C. to 120° C., and then forming said i-type semiconductor layer at said second substrate temperature higher than said first substrate temperature.

4. A method of manufacturing a non-single-crystal thin film solar cell according to claim 2, comprising the steps of:

forming a part of said first-conductivity-type layer at said first substrate temperature, which is about 70° C. to 120° C.;

forming the rest of said first-conductivity-type layer at said second substrate temperature higher than said first substrate temperature; and forming said i-type semiconductor layer at a higher substrate temperature than said first substrate temperature.

5. A method of manufacturing a non-single-crystal thin film solar cell according to claim 2, comprising the steps of:

forming said first-conductivity-type layer at said first substrate temperature, which is about 70° C. to 120° C.;

forming a part of said i-type semiconductor layer at said first substrate temperature; and forming the rest of said i-type semiconductor layer at said second substrate temperature higher than said first substrate temperature.

6. A method of manufacturing a non-single-crystal thin film solar cell according to claim 2, wherein:

said i-type semiconductor layer is made of a silicon germanium alloy.

7. A method of manufacturing a non-single-crystal silicon or silicon alloy thin film solar cell, which comprises laminating together (a) a first-conductivity-type layer comprising mainly microcrystalline phases and (b) a second-conductivity-type layer of a reverse-conductivity-type to said first-conductivity-type layer, to form a lamination layer comprising mainly microcrystalline phases, on a substrate coated with a conductive film, and forming a transparent electrode and a grid electrode, said method comprising the steps of:

forming a first part of said lamination layer at a first substrate temperature that prevents formation of amorphous phase at an initial stage of film formation, and forming the rest of said lamination layer thereon at a second substrate temperature higher than said first substrate temperature that (a) increases crystal grain size to improve crystallinity and photoelectric characteristics of the film, and (b) anneals the first part of said lamination layer.

8. A method of manufacturing a non-single-crystal silicon or silicon alloy thin film solar cell, which comprises laminating together (a) a first-conductivity-type layer comprising mainly microcrystalline phases and (b) a second-conductivity-type layer of a reverse-conductivity-type to said first-conductivity-type layer, to form a lamination layer comprising mainly microcrystalline phases, on a transparent substrate coated with conductive transparent film, and forming a metal electrode, said method comprising the steps of:

forming a first part of said lamination layer at a first substrate temperature that prevents formation of amorphous phase at an initial stage of film formation, and forming the rest of said lamination layer thereon at a second substrate temperature higher than said first substrate temperature that (a) increases crystal grain size to improve crystallinity and photoelectric characteristics of the film, and (b) anneals the first part of said lamination layer.

9. A method of manufacturing a non-single-crystal thin film solar cell according to claim 8, comprising the steps of:

forming said first-conductivity-type layer at said first substrate temperature, which is about 70° C. to 120° C., and then forming said second-conductivity-type layer at said second substrate temperature higher than said first substrate temperature.

10. A method of manufacturing a non-single-crystal thin film solar cell according to claim 8, comprising the steps of:

forming a part of said first-conductivity-type layer at said first substrate temperature, which is about 70° C. to 120° C.;

forming the rest of said first-conductivity-type layer at said second substrate temperature higher than said first substrate temperature; and forming said second-conductivity-type layer at a higher substrate temperature than said first substrate temperature.

11. A method of manufacturing a non-single-crystal thin film solar cell according to claim 8, comprising the steps of:

forming said first-conductivity-type layer at said first substrate temperature, which is about 70° C. to 120° C., and then forming a part of said second-conductivity-type layer at said first substrate temperature; and forming the rest of said second-conductivity-type layer at said second substrate temperature higher than said first substrate temperature.

12. A method of manufacturing a non-single-crystal thin film solar cell according to claim 8, comprising the step of:

continuously making at least a part of the change from said first substrate temperature to said second substrate temperature while forming the first-conductivity-type layer or second-conductivity-type layer.

13. A method of manufacturing a non-single-crystal thin film solar cell according to claim 8, wherein:

said second substrate temperature is not less than about 120° C. and not greater than about 450° C.

14. A method of manufacturing a non-single-crystal thin film solar cell according to claim 8, wherein:

said first-conductivity-type layer is made of a silicon alloy selected from the group consisting of a silicon oxide, a silicon carbide and a silicon nitride.

15. A method of manufacturing a non-single-crystal thin film solar cell according to claim 8, wherein:

said second-conductivity-layer is an amorphous film or a non-crystalline film including microcrystalline phases.

16. A method of manufacturing a non-single-crystal thin film solar cell according to claim 15, wherein:

said second-conductivity-type layer is made of a silicon alloy selected from the group consisting of a silicon oxide, a silicon carbide and a silicon nitride.

* * * * *